United States Patent
Silber et al.

(10) Patent No.: US 12,174,238 B2
(45) Date of Patent: Dec. 24, 2024

(54) INTELLIGENT WAFER-LEVEL TESTING OF PHOTONIC DEVICES

(71) Applicant: MELLANOX TECHNOLOGIES, LTD., Yokneam (IL)

(72) Inventors: Amir Silber, Rehovot (IL); Barak Freedman, Binyamina (IL); Nizan Meitav, Kiryat Ata (IL); Santiago Echeverri, Copenhagen (DK); Jochem Verbist, Berchem (BE); Allan Green-Petersen, Smoerum (DK)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 206 days.

(21) Appl. No.: 17/463,587

(22) Filed: Sep. 1, 2021

(65) Prior Publication Data

US 2023/0063481 A1 Mar. 2, 2023

(51) Int. Cl.
*G01R 31/26* (2020.01)
*G01R 1/24* (2006.01)

(52) U.S. Cl.
CPC ........... *G01R 31/2635* (2013.01); *G01R 1/24* (2013.01)

(58) Field of Classification Search
CPC ...... G01R 31/26; G01R 31/2635; G01R 1/24; G01R 1/0491; G01R 31/28; G01R 31/2831; G01R 31/2886; G01R 31/2887; G01R 31/2889; G01R 31/31728
See application file for complete search history.

(56) References Cited

U.S. PATENT DOCUMENTS

| | | | |
|---|---|---|---|
| 9,395,488 B2* | 7/2016 | Whitbread | G02B 6/12 |
| 2012/0237161 A1* | 9/2012 | Ross | G02B 6/125 |
| | | | 385/24 |
| 2017/0363507 A1* | 12/2017 | Carpentier | G01R 31/2656 |
| 2018/0313718 A1* | 11/2018 | Traverso | G02B 6/1228 |
| 2020/0033228 A1 | 1/2020 | Piazza et al. | |
| 2020/0136728 A1* | 4/2020 | Sugiyama | G02B 6/4201 |
| 2020/0209704 A1* | 7/2020 | Masini | G02F 1/2257 |
| 2020/0264391 A1* | 8/2020 | Tummidi | G02B 6/424 |

OTHER PUBLICATIONS

Suzuki et al., "Multiport Optical Switches Inegrated on Si Photonics Platform," Review Paper, IEICE Electronic Express, vol. 11, No. 24, pp. 1-13, Dec. 25, 2014.
Verheyen et al., "Highly Uniform 28Gb/s Si Photonics Platform for High-Density, Low-Power WDM Optical Interconnects," Conference Paper, pp. 1-4, Jan. 2014.
Butt et al., "Optical Elements Based on Silicon Photonics", Computer Optics, vol. 43, issue 6, pp. 1079-1083, year 2019.

* cited by examiner

*Primary Examiner* — Son T Le
(74) *Attorney, Agent, or Firm* — MEITAR PATENTS LTD.

(57) ABSTRACT

A wafer includes a semiconductor substrate, multiple photonics devices and a test coupler. The multiple photonics devices are fabricated on the substrate and have multiple respective ports. The test coupler is disposed on the wafer and is configured to couple an optical test signal between a tester and the multiple ports of the multiple photonics devices during testing of the photonics devices.

21 Claims, 5 Drawing Sheets

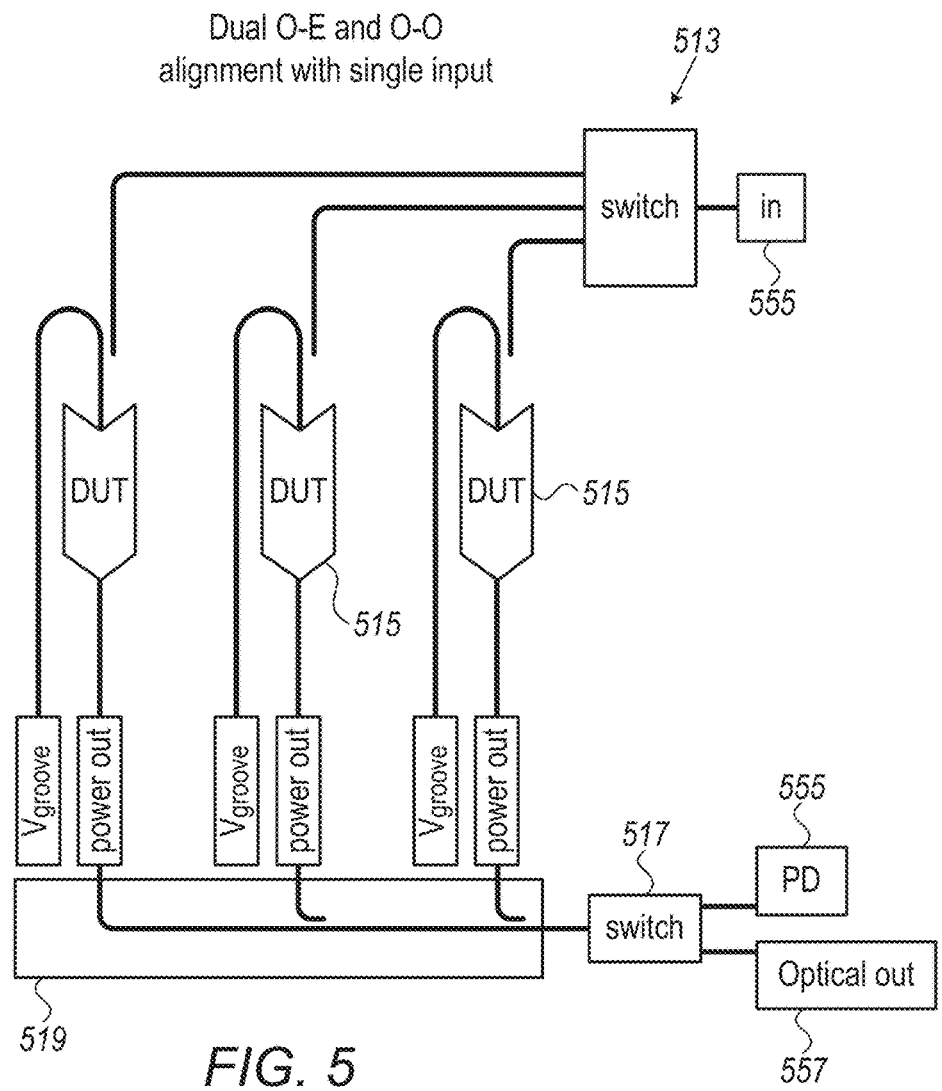
FIG. 5
FIG. 6
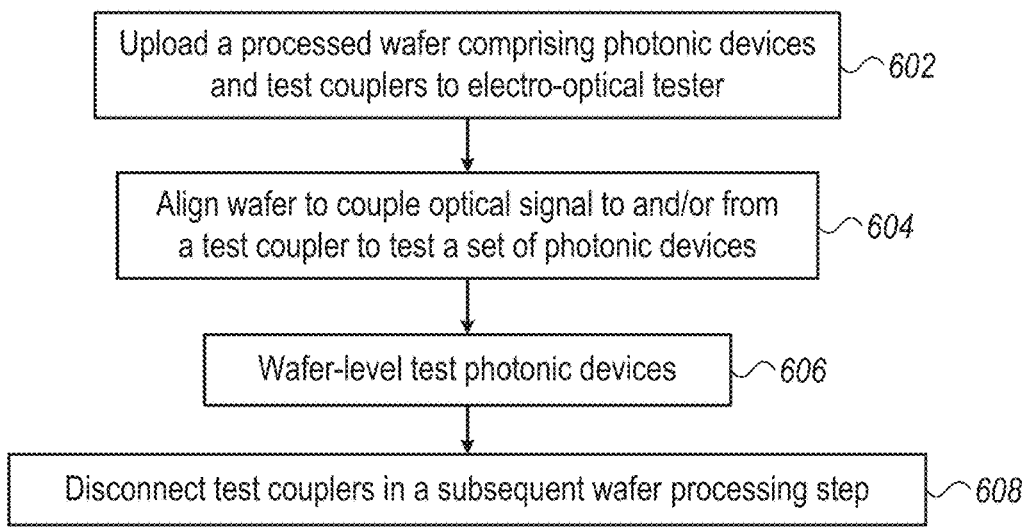

INTELLIGENT WAFER-LEVEL TESTING OF PHOTONIC DEVICES

FIELD OF THE INVENTION

The present invention relates generally to wafer-level testing of devices, and particularly to automated wafer-level testing of photonic devices such as silicon photonics (SiPh) devices.

BACKGROUND OF THE INVENTION

Various techniques for wafer-level testing of photonics devices have been proposed in the patent literature. For example, U.S. Patent Application Publication 2 photonic testing device that includes a substrate, an optical device under test (DUT) disposed over the substrate, and an optical input circuit disposed over the substrate. The optical input circuit includes a first plurality of inputs each configured to transmit a respective optical test signal of a plurality of optical test signals. Each of the plurality of optical test signals includes a respective dominant wavelength of a plurality of dominant wavelengths. The optical input circuit further includes an output coupled to an input waveguide of the optical DUT. The output is configured to transmit a combined optical test signal comprising the plurality of optical test signals.

As another example, U.S. Pat. No. 9,395,488 describes sacrificial optical test structures that are constructed upon a wafer of pre-cleaved optical chips for testing the optical functions of the pre-cleaved optical chips. The sacrificial optical structures are disabled upon the cleaving the optical chips from the wafer and the cleaved optical chips can be used for their desired end functions. The test structures may remain on the cleaved optical chips or they may be discarded.

SUMMARY OF THE INVENTION

An embodiment of the present invention that is described hereinafter provides a wafer including a semiconductor substrate, multiple photonics devices, and a test coupler. The multiple photonics devices are fabricated on the substrate and have multiple respective ports. The test coupler is disposed on the wafer and is configured to couple an optical test signal between a tester and the multiple ports of the multiple photonics devices during testing of the photonics devices.

In some embodiments, the photonics devices are Silicon Photonics (SiPh) devices.

In some embodiments, the SiPh devices are Mach-Zehnder modulators (MZM). In other embodiments, the SiPh devices are photodiodes (PDs)

In some embodiments, the test coupler is configured to be disconnected from the photonics devices following the testing.

In some embodiments, the test coupler is connected to respective input ports of the multiple photonics devices, and is configured to couple the optical test signal from the tester to the input ports.

In other embodiments, the test coupler is connected to respective output ports of the multiple photonics devices, and is configured to couple the optical test signal from the output ports to the tester.

In an embodiment, the test coupler includes a cascade of multiple tap couplers respectively connected to the multiple photonics devices.

In another embodiment, the test coupler includes a planar optical waveguide array.

In some embodiments, the multiple photonics devices are configured to receive respective activation electrical signals from the tester.

In some embodiments, the test coupler is configured to couple an optical test signal in an optical communication band.

There is additionally provided, in accordance with an embodiment of the present invention, a method for testing including providing a wafer, the wafer including (i) a semiconductor substrate, (ii) multiple photonics devices, which are fabricated on the substrate and have multiple respective ports, and (iii) a test coupler, which is disposed on the wafer and is configured to couple an optical test signal between a tester and the multiple ports of the multiple photonics devices during testing of the photonics devices. The tester is connected to the test coupler. The multiple photonics devices are tested using the optical test signal.

In some embodiments, testing the multiple photonics devices includes applying to the multiple photonics devices respective activation electrical signals from the tester.

In some embodiments, testing the multiple photonics devices includes applying the optical test signal in an optical communication band.

In other embodiments, connecting the tester to the test coupler includes performing a single alignment step between the tester and the test coupler, for testing all the multiple photonics devices.

The present invention will be more fully understood from the following detailed description of the embodiments thereof, taken together with the drawings in which:

BRIEF DESCRIPTION OF THE DRAWINGS

FIG. 5 is a schematic, pictorial diagram of photonic DUTs and a photodiode being tested using a test coupler and an on-chip switch, in accordance with an embodiment of the present invention; and FIG. 6 is a flow chart schematically illustrating a method of wafer-level testing (WLT) using sacrificial test couplers disposed on the wafer, in accordance with an embodiment of the present invention.

DETAILED DESCRIPTION OF EMBODIMENTS

Overview

Figure 1:
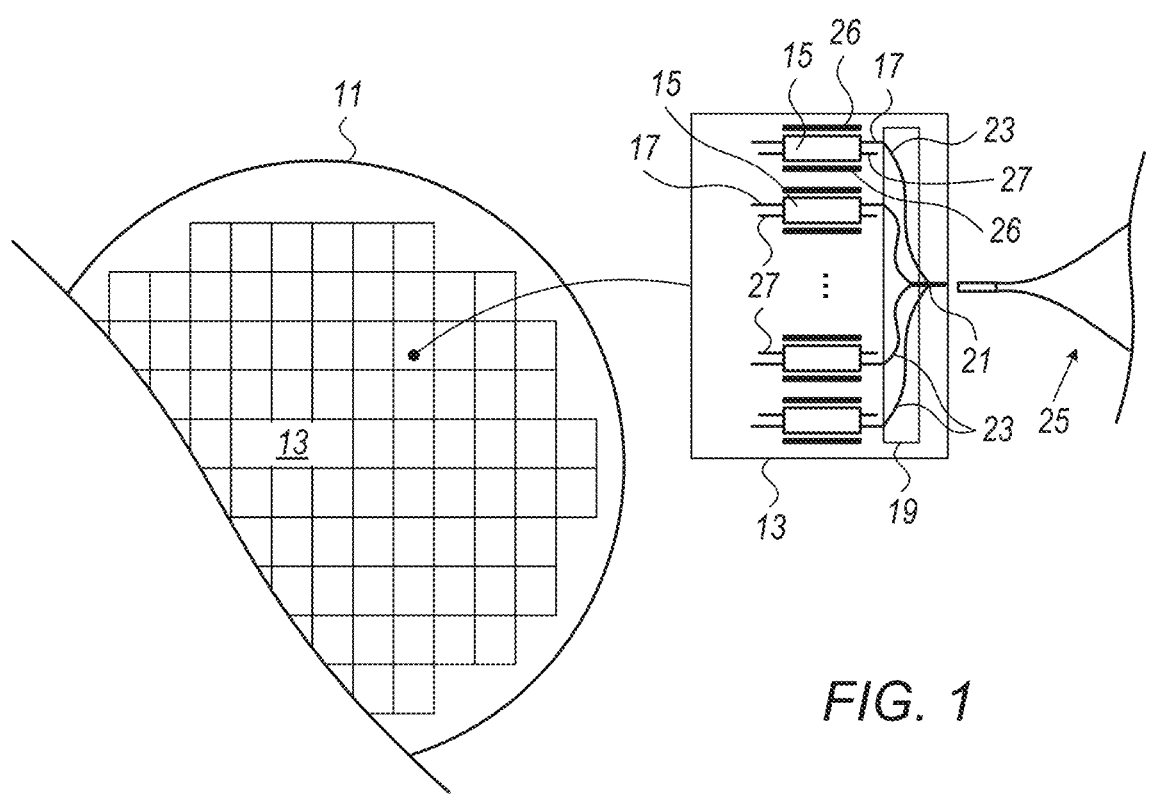
FIG. 1 is a schematic, pictorial top view of a wafer comprising photonics devices under test (DUTs) being tested using a test coupler, in accordance with an embodiment of the present invention.

Modern photonic chips carry multiple photonic devices fabricated in dies ("chips") of a wafer. It is typically desirable that any of the photonic chips will be wafer-level tested (WLT) prior to subsequent integration of the chips into a photonic system. However, WLT of photonic chips is slow and costly due to difficulties in coupling optical test signals in and/or out of the numerous photonic devices disposed in each chip. One such particular challenge of WLT is to optically align the input and output ports of each photonic device under test (photonic DUT), with, for example, fiber tips of an external tester.

Embodiments of the present invention that are described hereinafter provide wafer configurations and methods for quick wafer-level testing of multiple photonic devices on the wafers. Some embodiments employ wafer layouts that enable testing multiple devices on a die of a wafer with a single input and/or output alignment step of an external tester. To this end, the disclosed techniques use structures processed on the wafer, such as combiners and vertical couplers, to enable the tester to access the multiple photonic devices in parallel.

In example embodiments, a disclosed wafer comprises test-coupler structures that require a single alignment of the input or output terminal of a test coupler with the tester for testing multiple devices under test (DUTs). In addition, using such a common waveguide coupler (e.g., a waveguide array coupler) simplifies comparison between DUTs. The optical signal used for testing different devices can be differentiated based on modulation and/or demultiplexing for parallel testing, as described below.

In one embodiment, a wafer is provided that comprises a semiconductor substrate and multiple photonics devices that are fabricated on the substrate and have multiple respective ports. A test coupler is further disposed on the wafer and is configured to couple an optical test signal between an external tester (e.g., optical fibers of an automated testing unit) and the multiple ports of the multiple photonics devices during testing of the photonics devices. The test coupler is configured to be disconnected from the photonics devices following the testing. For example, once the wafer-level measurement is completed, an input/or output channel of the coupler is no longer needed, and the channels are removed during later steps of the etching process.

In another embodiment, the test coupler comprises a cascade of multiple tap couplers respectively connected to the multiple photonics devices, as described below.

Assuming that a bus waveguide coupler with a single input is used with a set of DUTs, splitting the input optical test signal can be done by an on-chip optical switch or by using a wavelength division and multiplexing (WDM) unit, as described below. In general, although not necessarily, a switch may be beneficial for comparing DUTs since the same input power is transferred to each DUT. Using a WDM unit enables, for example, testing of different photonic devices configured to operate at different wavelengths.

The disclosed test-coupler structures and the related disclosed testing methods require only a single optical alignment for coupling the optical signal to the multiple DUTs being tested. As such, the disclosed techniques enable fast and reliable WLT of photonic devices, including enabling separate measurement of individual DUTs with a single alignment.

System Description

FIG. 1 is a schematic, pictorial top view of a wafer 11 comprising photonic devices under test (DUTs) 15 being tested using a test coupler 19, in accordance with an embodiment of the present invention. As seen, wafer 11 comprises multiple dies 13, with each die 13 disposed with multiple photonic devices 15 and with. A single test coupler 19 couples an optical signal into (or out of) ports 17 of the respective photonic devices 15 from (or to) an external tester 25. To this end, test coupler 19 is configured as a bus having a single terminal 21 on the tester end and multiple terminals (e.g., tap couplers) 23 at the device end. Other ports of devices 15, such as ports 27, may be used to receive or transmit the optical test signal.

In the shown example, each photonic device 15 (also referred to as "DUT") further comprises electrical pads 26 that enable external tester 25 to operate/control the photonic device by applying control/supply voltages. For example, electrical pads 26 can be electrical pads of a Mach-Zehnder modulator (MZM).

The top view shown in FIG. 1 is chosen purely for the sake of conceptual clarity. While the shown embodiment is of MZM devices, other devices may be included, such as arrayed waveguides (AWG) and photo diodes (PD).

Elements of the external tester that are not mandatory for understanding the disclosed techniques, such as a mechanical stage and measurement equipment, are omitted from the figure for simplicity of presentation.

Figure 2A:
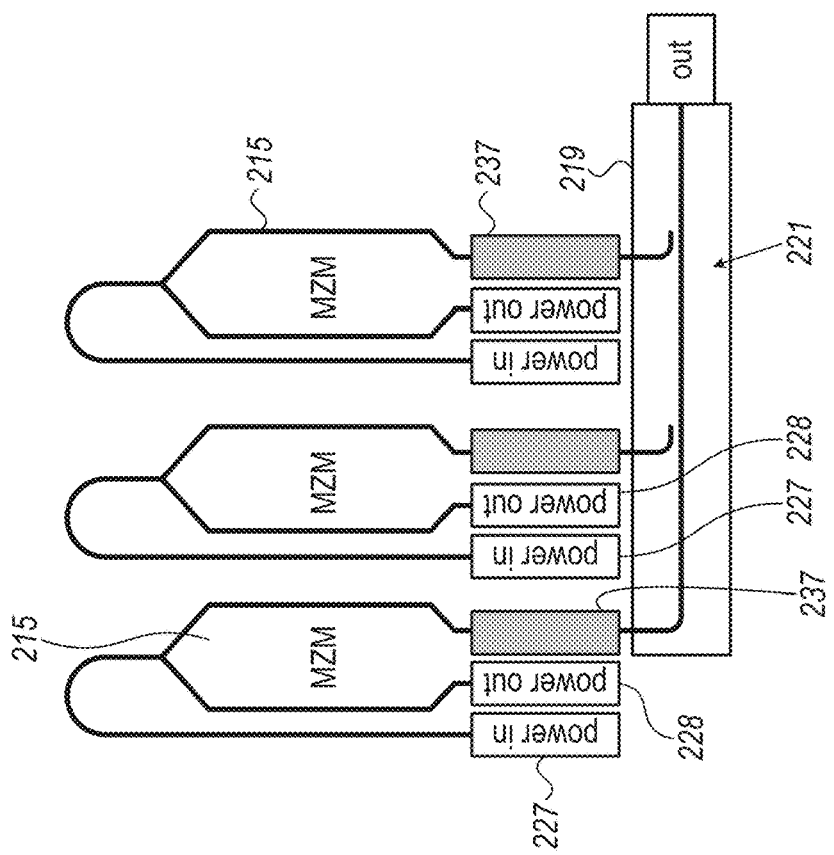
FIGS. 2A and 2B are schematic, pictorial diagrams of photonic DUTs comprising Mach-Zehnder modulators (MZM) being tested using a test coupler (FIG. 2A), and of the photonic DUTs after being disconnected from the test coupler (FIG. 2B), in accordance with an embodiment of the present invention.
Figure 2B:
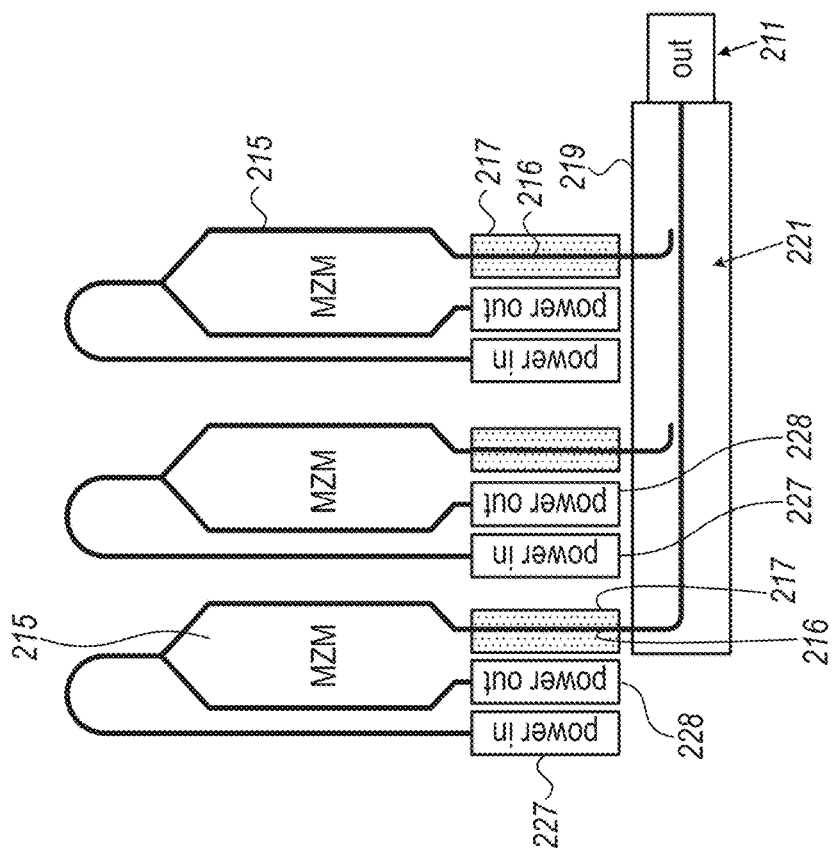

Photonics Device Testing with Single Input and/or Output Alignment by Fabrication of a Bus Waveguide FIGS. 2A and 2B are schematic, pictorial diagrams of photonic DUTs 215 comprising Mach-Zehnder modulator (MZM), being tested using a test coupler 219 (FIG. 2A), and of photonic DUTs 215 after being disconnected from test coupler 219 (FIG. 2B), in accordance with an embodiment of the present invention. As seen, test coupler 219 comprises a bus waveguide coupler 221 that uses a splitter layout of the bus waveguide to couple optical test signals from output ports 216 of respective DUTs 215 into a single output terminal 211 of test coupler 219. As seen, the waveguides of ports 216 are located in respective areas 217, where areas 217 are designated to be etched to disconnect ports 214 after testing is completed, as shown in FIG. 2B.

In the embodiment shown in FIG. 2A, various DUTs 215 receive, at separate times, optical test signals coupled into devices 215 from respective ports 227. The optical test signal is subsequently coupled out (after being affected by each DUT 215) without impacting the amount of power reaching the DUT. Also seen is a second port (228) of each MZM, which is not used in the testing.

As FIG. 2B shows, once the measurement of FIG. 2A is completed and the splitters of coupler 219 are no longer needed, the splitters are disconnected (237) during a later etching or laser ablation process step.

The block diagrams shown in FIGS. 2A and 2B were chosen purely for the sake of conceptual clarity. For example, while in the shown embodiment the outputs are removed by etching, other locations may be etched, or removed, e.g., as the die is cleaved.

Using Tap Coupling at DUT Input

Figure 3B:
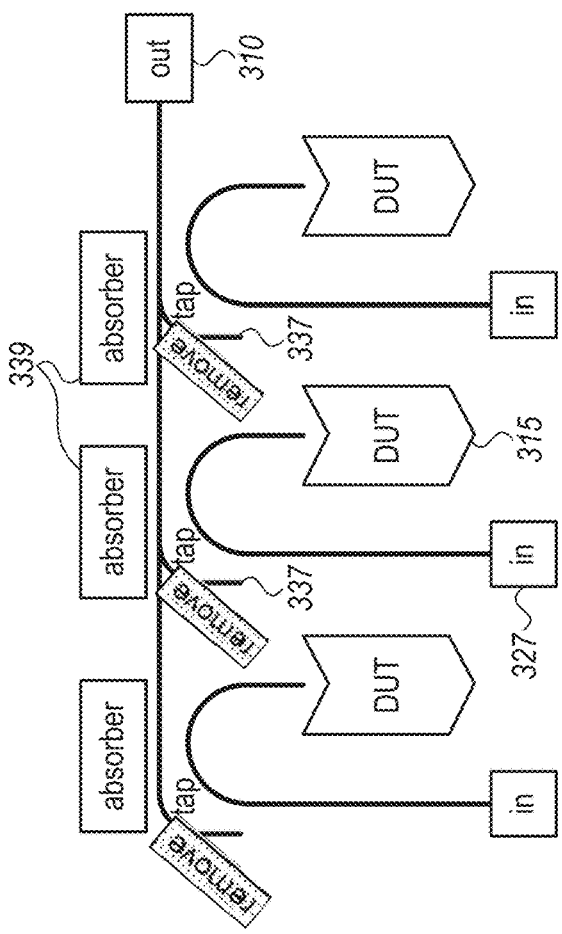
FIGS. 3A and 3B are schematic, pictorial diagrams of photonic DUTs being tested using a test tap-coupler (FIG. 3A), and the photonic DUTs after being disconnected from the test tap-coupler (FIG. 3B), in accordance with an embodiment of the present invention.
Figure 3A:
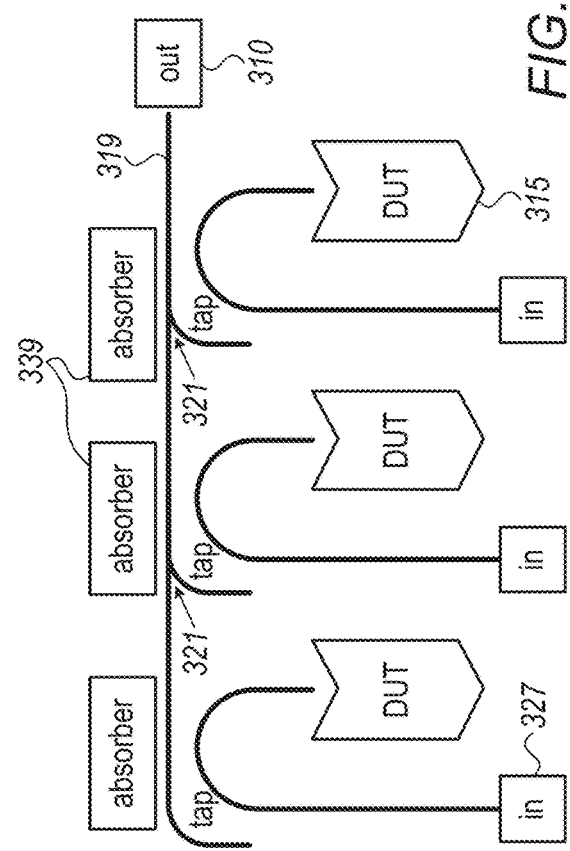

FIGS. 3A and 3B are schematic, pictorial diagrams of photonic DUTs 315 being tested using a test tap coupler 319 (FIG. 3A), and the photonic DUTs after being disconnected from test tap coupler 319 (FIG. 3B), in accordance with an embodiment of the present invention. The test tap coupler is disposed on the same die with DUTs 315. As seen in FIG. 3A, the input optical signal is injected, or coupled, to each of DUTs 315 via respective input ports 317.

In the shown embodiment, the tap coupler guides a resulting output optical signal via tap channels 321 to which each device 315 is coupled into a single output terminal 310. At terminal 310 an external tester (not shown) is aligned to receive the output signal for analysis of each DUT 315 in turn without a need to optically realign the tester (or wafer) for each DUT 315.

As FIG. 3B shows, once the measurement of FIG. 3A is completed and the tapping channels 321 of coupler 319 are no longer needed, the tap channels are removed (337) during later layer removal process, such as by etching or laser ablation. Absorbers 339 can be placed in order to avoid scattering from the waveguides that were removed, in cases in which not an entire waveguide was removed by process.

The block diagrams shown in FIGS. 3A and 3B were chosen purely for the sake of conceptual clarity. For example, in other embodiments, a test coupler of any kind can also be used with the input ports.

Using on-Chip Switch or Demultiplexer

Figure 4B:
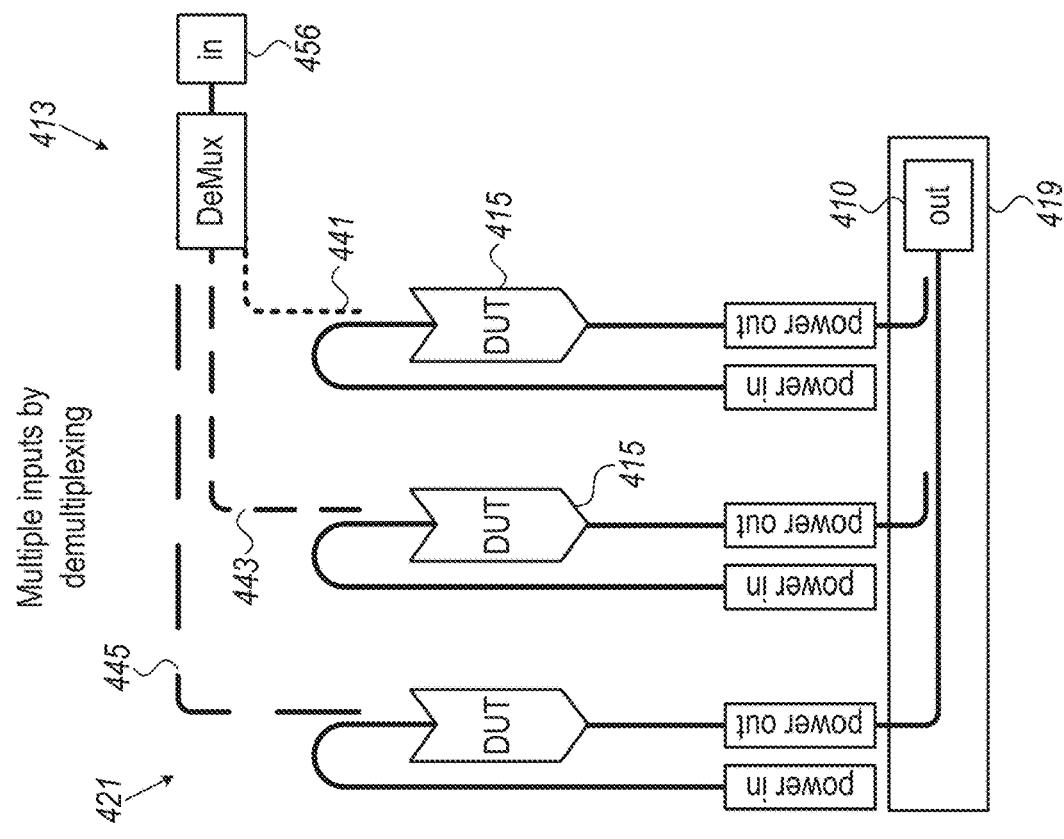
FIGS. 4A and 4B are schematic, pictorial diagrams of photonic DUTs being tested using an on-chip switch (FIG. 4A), and using an on-chip wavelength demultiplexer (FIG. 4B), in accordance with some embodiments of the present invention.
Figure 4A:
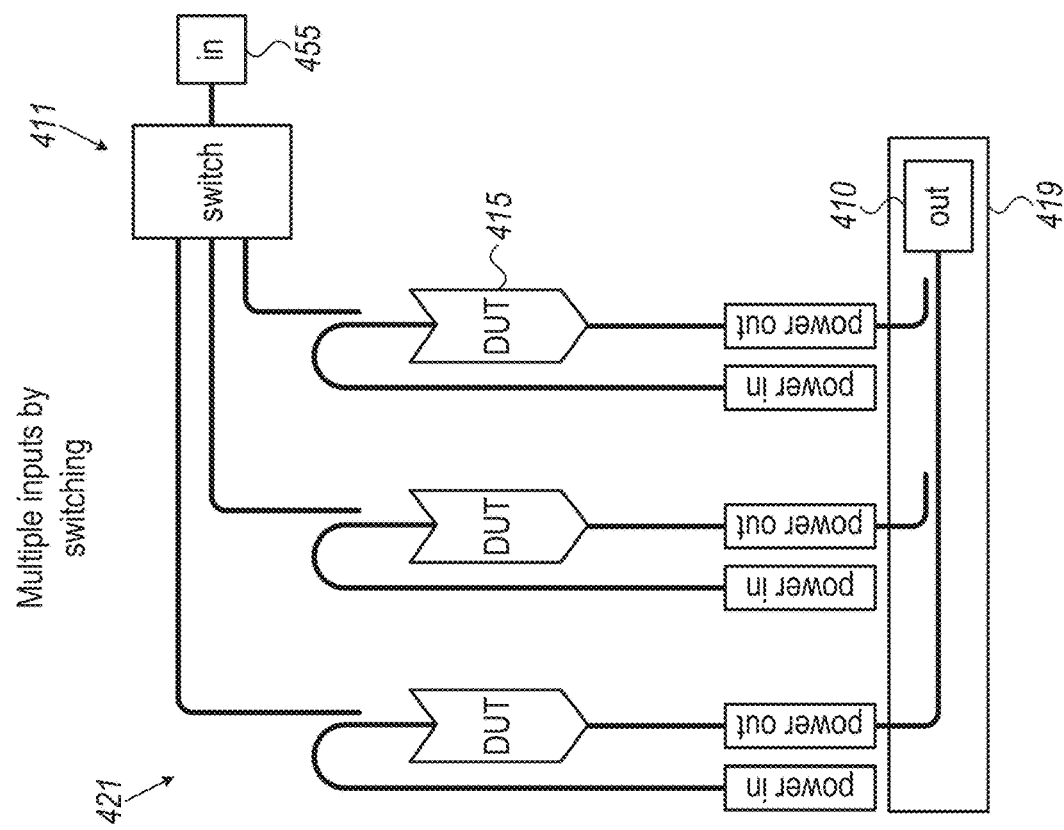

FIGS. 4A and 4B are schematic, pictorial block diagrams of photonic DUTs 415 being tested using an on-chip switch 411 (FIG. 4A), and using an on-chip wavelength demultiplexer 413 (FIG. 4B), in accordance with some embodiments of the present invention. As further seen, a test coupler 419 with single output terminal 410 is used in the testing to enable testing multiple DUTs 415, which saves repeated alignment steps by an external tester.

As seen in FIG. 4A, on-chip switch 411 has an input terminal 455 that provides input splitting with each DUT being coupled used a splitter 421. Thus, using switch 411 is beneficial for comparing DUT 415 performance since the same input power is transferred to each of the DUTs 415.

As seen in FIG. 4B, an on-chip demultiplexer 413 with an input terminal 456 provides input splitting according to wavelengths to the different DUTs 441, 443, 445. Each DUT 415 is coupled with a splitter 421 to each wavelength. Using demultiplexer 413, the performance of different DUTs can be measured separately for each DUT according to a specific wavelength, such as in a wavelength grid of a communication band. As with FIG. 4A, a test coupler 419 is used on the output end to enable using a single output terminal 410 with an external tester.

The block diagrams shown in FIGS. 4A and 4B were chosen purely for the sake of conceptual clarity. For example, in other embodiments, both an input switch and an output switch may be used in FIG. 4A, and both an input multiplexer and an output demultiplexer may be used in FIG. 4B.

FIG. 5 is a schematic, pictorial block diagram of photonic DUTs 515 and a photodiode 555, all being tested using a test coupler 519 and a switch 517, in accordance with an embodiment of the present invention.

In many photonic chips a photodetector (PD) is part of the photonic chip. In that case, on-chip switch 517 is coupled and used in the output channel, to sample both O-O (optical in, optical monitor) 557 and O-E (optical in, electrical monitor) 55 regimes. This allows calibration of die PD 555 using another optical terminal 557. On the input side, the shown embodiment uses a switch 515 with an input terminal 555, in a similar way to that described above in FIG. 4A.

A Method for WLT of Photonics Devices with Single Input and/or Output of an on-Wafer Sacrificial Test Coupler FIG. 6 is a flow chart schematically describing a method of wafer level testing (WLT) using sacrificial test couplers disposed on the wafer, in accordance with an embodiment of the present invention. The process begins at a wafer uploading step 602, in which a processed wafer comprising photonic DUTs (e.g., photonic DUTs 215) and test couplers (e.g., test coupler 219) is uploaded to an external electro-optical tester.

Next, the external tester is operated to align the wafer so as to couple optical signals to and/or from one of the test coupler terminals to test a set of photonic DUTs, at an optical alignment step 604.

At a WLT step 606, the external tester is operated for a wafer-level test of the photonic devices.

Finally, once testing is completed, the wafer is returned to the processing line to disconnect the test couplers in ways such as shown in FIGS. 2B, 3B, and 4B, comprising performing subsequent wafer processing step, at a test coupler disconnecting step 608.

Although the embodiments described herein mainly address wafer level testing of photonic devices, the methods and systems described herein can also be used in other applications, such as in Photonics substrates and MEMS.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A wafer, comprising:
   a semiconductor substrate;
   multiple photonics devices, which are fabricated on the substrate and have multiple respective ports; and
   a test coupler, which is disposed on the wafer and connected to the multiple photonics devices, the test coupler being configured to facilitate parallel testing of the multiple photonics devices using a single optical test signal, by coupling the optical test signal between a tester and the multiple ports of the multiple photonics devices during the parallel testing of the photonics devices, wherein the test coupler is connected to the photonics devices via one or more optical waveguide sections that are designated to be removed from the wafer following the testing, thereby disconnecting the test coupler; and
   one or more absorbers that are placed on the wafer to absorb scattering caused by removal of the one or more optical waveguide sections.

2. The wafer according to claim 1, wherein the photonics devices are Silicon Photonics (SiPh) devices.

3. The wafer according to claim 2, wherein the SiPh devices are Mach-Zehnder modulators (MZM).

4. The wafer according to claim 2, wherein the SiPh devices are photodiodes (PDs).

5. The wafer according to claim 1, wherein the test coupler is connected to respective input ports of the multiple photonics devices, and is configured to couple the optical test signal from the tester to the input ports.

6. The wafer according to claim 1, wherein the test coupler is connected to respective output ports of the multiple photonics devices, and is configured to couple the optical test signal from the output ports to the tester.

7. The wafer according to claim 1, wherein the test coupler comprises a planar optical waveguide array.

8. The wafer according to claim 1, wherein the multiple photonics devices are configured to receive respective activation electrical signals from the tester.

9. The wafer according to claim 1, wherein the test coupler is configured to couple an optical test signal in an optical communication band.

10. The wafer according to claim 1, wherein the test coupler comprises a cascade of multiple tap couplers respectively connected to the multiple photonics devices.

11. A method for testing, comprising:
  providing a wafer, comprising:
    a semiconductor substrate;
    multiple photonics devices, which are fabricated on the substrate and have multiple respective ports;
    a test coupler disposed on the wafer, the test coupler being connected to the multiple photonics devices via one or more optical waveguide sections that are designated to be removed from the wafer following the testing, the test coupler to facilitate parallel testing of the multiple photonics devices using a single optical test signal, by coupling the optical test signal between a tester and the multiple ports of the multiple photonics devices during the parallel testing of the photonics devices; and
    one or more absorbers that are placed on the wafer to absorb scattering caused by removal of the one or more optical waveguide sections;
  connecting the tester to the test coupler;
  testing the multiple photonics devices using the optical test signal; and
  disconnecting the test coupler from the photonics devices following the testing, by removing the tap channels from the wafer.

12. The method according to claim 11, wherein the photonics devices are Silicon Photonics (SiPh) devices.

13. The method according to claim 12, wherein the SiPh devices are Mach-Zehnder modulators (MZM).

14. The method according to claim 12, wherein the SiPh devices are photodiodes (PDs).

15. The method according to claim 11, wherein the test coupler is connected to respective input ports of the multiple photonics devices, and is configured to couple the optical test signal from the tester to the input ports.

16. The method according to claim 11, wherein the test coupler is connected to respective output ports of the multiple photonics devices, and is configured to couple the optical test signal from the output ports to the tester.

17. The method according to claim 11, wherein the test coupler comprises a planar optical waveguide array.

18. The method according to claim 11, wherein testing the multiple photonics devices comprises applying to the multiple photonics devices respective activation electrical signals from the tester.

19. The method according to claim 11, wherein testing the multiple photonics devices comprises applying the optical test signal in an optical communication band.

20. The method according to claim 11, wherein connecting the tester to the test coupler comprises performing a single alignment step between the tester and the test coupler, for testing all the multiple photonics devices.

21. The method according to claim 11, wherein the test coupler comprises a cascade of multiple tap couplers respectively connected to the multiple photonics devices.

* * * * *